United States Patent
Kim

(10) Patent No.: US 9,712,154 B1
(45) Date of Patent: Jul. 18, 2017

(54) VOLTAGE GENERATION CIRCUIT AND INTEGRATED CIRCUIT INCLUDING THE SAME

(71) Applicant: SK hynix Inc., Gyeonggi-do (KR)

(72) Inventor: Jung-Ung Kim, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/156,995

(22) Filed: May 17, 2016

(51) Int. Cl.
   *H03L 7/00* (2006.01)
   *H03K 17/22* (2006.01)
   *G05F 3/26* (2006.01)

(52) U.S. Cl.
   CPC ........... *H03K 17/223* (2013.01); *G05F 3/262* (2013.01)

(58) Field of Classification Search
   CPC .................................................. H03K 17/223
   See application file for complete search history.

(56) References Cited

U.S. PATENT DOCUMENTS

| | | | |
|---|---|---|---|
| 5,394,511 A * | 2/1995 | Mashiko | G06N 3/063 706/33 |
| 2013/0279273 A1* | 10/2013 | Choi | G11C 7/10 365/189.05 |

\* cited by examiner

*Primary Examiner* — Daniel Puentes
(74) *Attorney, Agent, or Firm* — IP & T Group LLP

(57) ABSTRACT

A voltage generation circuit includes a voltage generator initialized in response to a first power on reset signal, and generates an internal voltage on an output node using an external voltage; and a pull-down driving unit which pull-down drives the output node in response to a second power on reset signal delayed from the first power on reset signal.

5 Claims, 4 Drawing Sheets

VOLTAGE GENERATION CIRCUIT AND INTEGRATED CIRCUIT INCLUDING THE SAME

TECHNICAL FIELD

This patent document relates to a voltage generation circuit capable of generating internal voltages for various integrated circuits.

BACKGROUND

Various integrated circuits allow internal circuits to operate with a voltage supplied from an external source. However, since various types of voltages are used in integrated circuits, it is difficult to supply all voltages used in the integrated circuits from an external source. Therefore, integrated circuits include a voltage generation circuits for internally generating a plurality of voltages based on the voltage received from the external source.

Most circuits in an internal integrated circuit, in addition to the voltage generation circuits, start a normal operation after an initialization operation for initializing some nodes inside the circuits to a predetermined level for a stable operation. However, when the levels of internal voltages are largely out of their target values immediately after the initialization operation of the voltage generation circuits, circuits operating with the internal voltages output from the voltage generation circuits are either abnormally operated or completely out of order.

SUMMARY

The present disclosure provides improved technology including a voltage generation circuit capable of a more stable operation.

In an embodiment, a voltage generation circuit may include a voltage generator initialized in response to a first power on reset signal, and generates an internal voltage on an output node using an external voltage; and a pull-down driving unit which pull-down drives the output node in response to a second power on reset signal delayed from the first power on reset signal.

The first power on reset signal POR1 may be enabled until a level of external voltage reaches a predetermined level, and be disabled after the level of external voltage reaches the predetermined level.

The voltage generator may include one or more PMOS transistors, and when the first power on reset signal is enabled, the one or more PMOS transistors may be turned on.

The pull-down driving unit may include a resistor and a switching element coupled in series between the output node and a ground terminal, and the switching element may be turned on/off in response to the second power on reset signal. The switching element may be a NMOS transistor.

The voltage generator may be any one of a beta-multiplier voltage generator, a band-gap voltage generator, and a low drop out (LDO) regulator voltage generator.

In an embodiment, an Integrated circuit may include a beta-multiplier voltage generator initialized in response to a first power on reset signal, and generates a first reference voltage on a first output node using an external voltage; a band-gap voltage generator initialized in response to the first power on reset signal, and generates a second reference voltage on a second output node using the external voltage; a low drop out regulator voltage generator initialized in response to the first power on reset signal, and generates an internal voltage on a third output node using any one of the first reference voltage and the second reference voltage, and the external voltage; and a first to a third pull-down driving units which pull-down drive output nodes corresponding thereto in response to a second power on reset signal delayed from the first power on reset signal.

DETAILED DESCRIPTION

Figure 1:
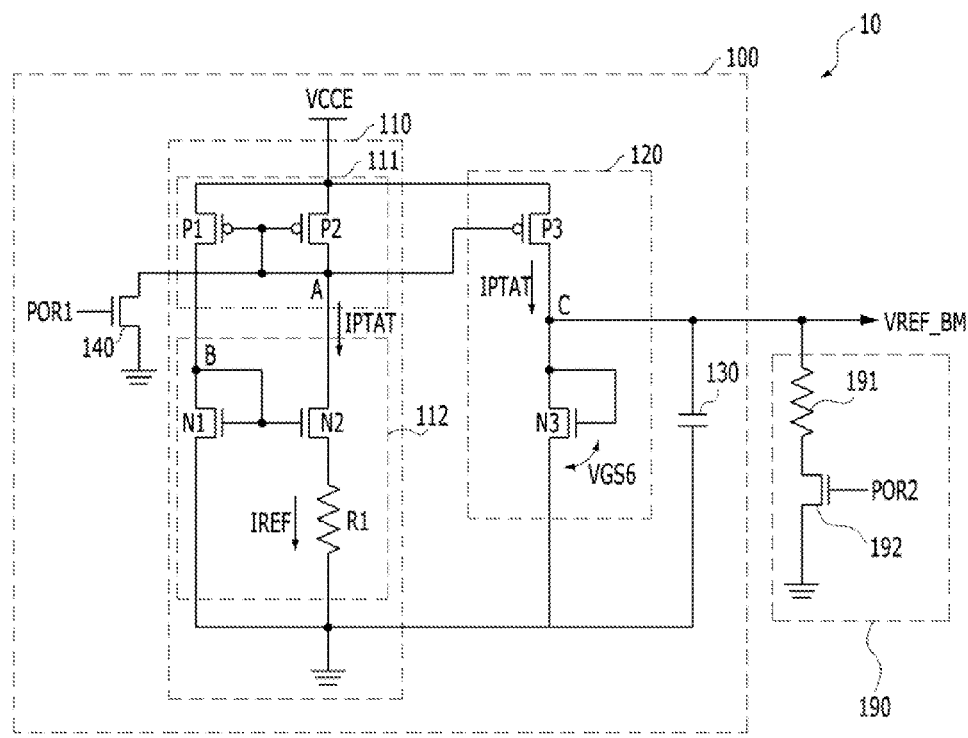
FIG. 1 is a configuration diagram illustrating a voltage generation circuit, in accordance with an embodiment of the invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in detail with reference to the attached drawings.

Referring now to FIG. 1 a voltage generation circuit is provided. in accordance with an embodiment of the present invention According to the embodiment of FIG. 1, the voltage generation circuit 10 may include a voltage generator 100 initialized in response to a first power on reset signal POR1 for generating an internal voltage VREF_BM on an output node C using an external voltage VCCE, and a pull-down driving unit 190 for pull-down driving the output node C in response to a second power on reset signal POR2 delayed from the first power on reset signal POR1. The voltage generator 100 illustrated in FIG. 1 may be referred to as a beta-multiplier voltage generator.

The voltage generator 100 may include an initialization unit 140 for initializing a control node A of PMOS transistors P1, P2 and P3 to a low level at a power-on reset. The initialization unit 140 may initialize the control node A to a low level during a high level of the first power on reset signal POR1 and thus stabilize an operation of the voltage generator 100 after the initialization. However, since the PMOS transistors P1, P2 and P3 are turned on by the initialization operation of the initialization unit 140, a voltage of the output node C may increase during the initialization operation of the initialization unit 140. During the initialization operation of the voltage generator 100, the internal voltage VREF_BM at the output node C may excessively increase, and a circuit operating with the internal voltage VREF_BM output from the voltage generation circuit may be abnormally operated or out of order due to the excessively increased level of the internal voltage VREF_BM.

The pull-down driving unit 190 may prevent the internal voltage VREF_BM from excessively increasing by pull-down driving the output node C in response to the second power on reset signal POR2 during the initialization operation of the voltage generator 100. The initialization unit 140 may include an NMOS transistor operable in response to the first power on reset signal POR1. The pull-down driving unit 190 may include a resistor 191 and a NMOS transistor 192 operable in response to the second power on reset signal POR2.

The voltage generator 100 may include a current generation unit 110, a voltage control unit 120 and a capacitor 130. The current generation unit 110 may operate as a beta-multiplier, and thus the voltage generator 100 may be a beta-multiplier voltage generator.

The current generation unit 110 of the beta-multiplier type may include a current mirror unit 111 and a temperature detection unit 112. The current mirror unit 111 may include a pair of the PMOS transistors P1 and P2 coupled in a current mirror configuration. The temperature detection unit 112 may include a pair of NMOS transistors N1 and N2 also coupled in a current mirror configuration and a resistor R1 for sensing temperature.

The voltage control unit 120 may include the PMOS transistor P3 for supplying current and a NMOS transistor N3 coupled as a diode type.

The capacitor 130 is coupled to the output node C at one of its terminals and to the ground voltage node at its other terminal. The capacitor 130 keeps the internal voltage VREF_BM on the output node C stable.

An operating process of the embodiment having the above-described configuration will be described.

A reference current Iref of the current generation unit 110 is a source current of the NMOS transistor N1. According to the following Equation 1, the reference current Iref having a small value may be obtained by increasing the resistance of the resistor R1, e.g. by increasing its size.

$$Iref = \frac{(VGS1 - VGS2)}{R} \quad \text{[Equation 1]}$$

Wherein, in Equation 1, VGS1 represents a gate-source voltage of the NMOS transistor N1, and VGS2 represents a gate-source voltage of the NMOS transistor N2.

The current generation unit 110 reduces an output impedance by detecting an increasing temperature. The current mirror unit 111 may perform mirroring on a reference current IPTAT corresponding to the output impedance of the temperature detection unit 112, and supply the reference current IPTAT to the control node A. Herein, the NMOS transistor N2 may operate at a weak inversion region. A drain current ID or the reference current IPTAT flowing through a path between the PMOS transistor P2 and the NMOS transistor N2 may be represented by the following Equation 2.

$$ID = \frac{n*VT}{R} * \ln K \quad \text{[Equation 2]}$$

Wherein, in Equation 2, K represents a transistor ratio of the NMOS transistor N2 to the NMOS transistor N1, n is a coefficient. Thermal voltage VT can be calculated based on the following Equation 3.

$$VT = kT/q \quad \text{[Equation 3]}$$

Wherein, in Equation 3, q represents an electron charge magnitude, k represents the Boltzmann constant, and T represents an absolute temperature of the PMOS transistor P2 and the NMOS transistor N2.

When Equation 2 is rearranged for a resistance value R, Equation 4 may be derived as follows.

$$R = \frac{n*VT}{ID} * \ln K \quad \text{[Equation 4]}$$

Through Equation 4, the resistance value R required for a target current (i.e., the reference current IPTAT) and a target beta ratio β (i.e., the transistor ratio K of the NMOS transistor N2 to the NMOS transistor N1) for the NMOS transistor N2 to operate at the weak inversion region.

Equation 2 may be derived into the following Equation 5 for a temperature coefficient TCI representing the variation of the drain current ID or the reference current IPTAT as a function of the temperature of the PMOS transistor P2 and the NMOS transistor N2.

$$TCI(\text{ppm}/^\circ \text{C.}) = \frac{1}{I}\frac{dI}{dT} = \frac{1}{VT}\frac{\partial VT}{\partial T} - \frac{1}{R}\frac{\partial R}{\partial T} \quad \text{[Equation 5]}$$

Referring to Equation 5, the drain current ID or the reference current IPTAT is proportional to the temperature change. The reference current IPTAT may be output from a drain of the PMOS transistor P3 through the current mirror unit 111. That is, the drain current ID partially-differentiated with respect to the temperature is represented by the thermal voltage and the resistance increasing with respect to the temperature, the drain current ID or the reference current IPTAT may be proportional to the temperature change.

The PMOS transistor P3 may supply a current to the NMOS transistor N3 in response to variation of the reference current IPTAT. A transistor has a characteristic that a threshold voltage thereof decreases as the temperature increases while the threshold voltage increases as the temperature decreases. Therefore, the NMOS transistor N3 may compensate the temperature variation or the variation of the reference current IPTAT and thus the internal voltage VREF_BM may become robust to the temperature variation.

The value of the drain current ID or the reference current IPTAT may depend on a gate-source voltage VGS of the NMOS transistor N3. The gate-source voltage VGS of the NMOS transistor N3 may be represented by the following Equation 6.

$$VGS = VTHN + \sqrt{\frac{2IPTAT}{\beta}} \quad \text{[Equation 6]}$$

Wherein, in Equation 6, VTHN may represent a threshold voltage of the NMOS transistor N3. Equation 6 may be expressed as following Equation 7.

$$VGS=Vth+(VGS-Vth) \quad \text{[Equation 7]}$$

In Equation 7, the gate-source voltage VGS of the NMOS transistor N3 minus the threshold voltage of the NMOS transistor N3 (VGS–Vth) may be obtained from the drain current ID or the reference current IPTAT as described above.

Equation 8 represents a variation of the threshold voltage of the NMOS transistor N3 with respect to the temperature.

$$VTHN(T)=VTHN(T0)*(1+TCVTHN*(T-T0)) \quad \text{[Equation 8]}$$

Wherein, in Equation 8, the threshold voltage VTHN is a negative temperature coefficient decreasing as the temperature increase.

In Equation 6, the reference current IPTAT is regarded as a positive temperature coefficient, and the threshold voltage VTHN is a negative temperature coefficient. Therefore, since variation of the coefficients of the gate-source voltage VGS of the NMOS transistor N3 according to the temperature change is canceled off, the internal voltage VREF_BM is less influenced by temperature variation. That is, even when the temperature changes, the internal voltage VREF_BM may be stably maintained.

Since the internal voltage VREF_BM generated by the beta-multiplier voltage generator 100 maintains a stable level even when the temperature changes, the internal voltage VREF_BM may be input to a circuit as a reference voltage.

Figure 2:
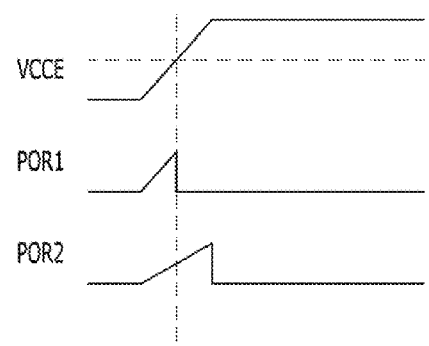
FIG. 2 is a diagram illustrating a first power on reset signal and a second power on reset signal, in accordance with an embodiment of the invention.

FIG. 2 is a diagram illustrating the first power on reset signal POR1 and the second power on reset signal POR2 in accordance with an embodiment.

The first power on reset signal POR1 may be enabled to a high level until the external voltage VCCE reaches a predetermined level, and disabled to a low level after the external voltage VCCE reaches the predetermined level.

The second power on reset signal POR2 may be slightly delayed from the first power on reset signal POR1. Therefore, the second power on reset signal POR2 may be disabled after the disablement of the first power on reset signal POR1 by the same delay amount as the second power on reset signal POR2 is delayed from the first power on reset signal POR1.

The first power on reset signal POR1 may be disabled to the low level with a little time delay following the time at which the external voltage VCCE reaches the predetermined level. In this case, the second power on reset signal POR2 may also be disabled after a little amount of time. That is, the second power on reset signal POR2 for activating the pull-down driving unit 190 may be sufficient as delayed from the first power on reset signal POR1 for initializing the voltage generator 100.

Figure 3:
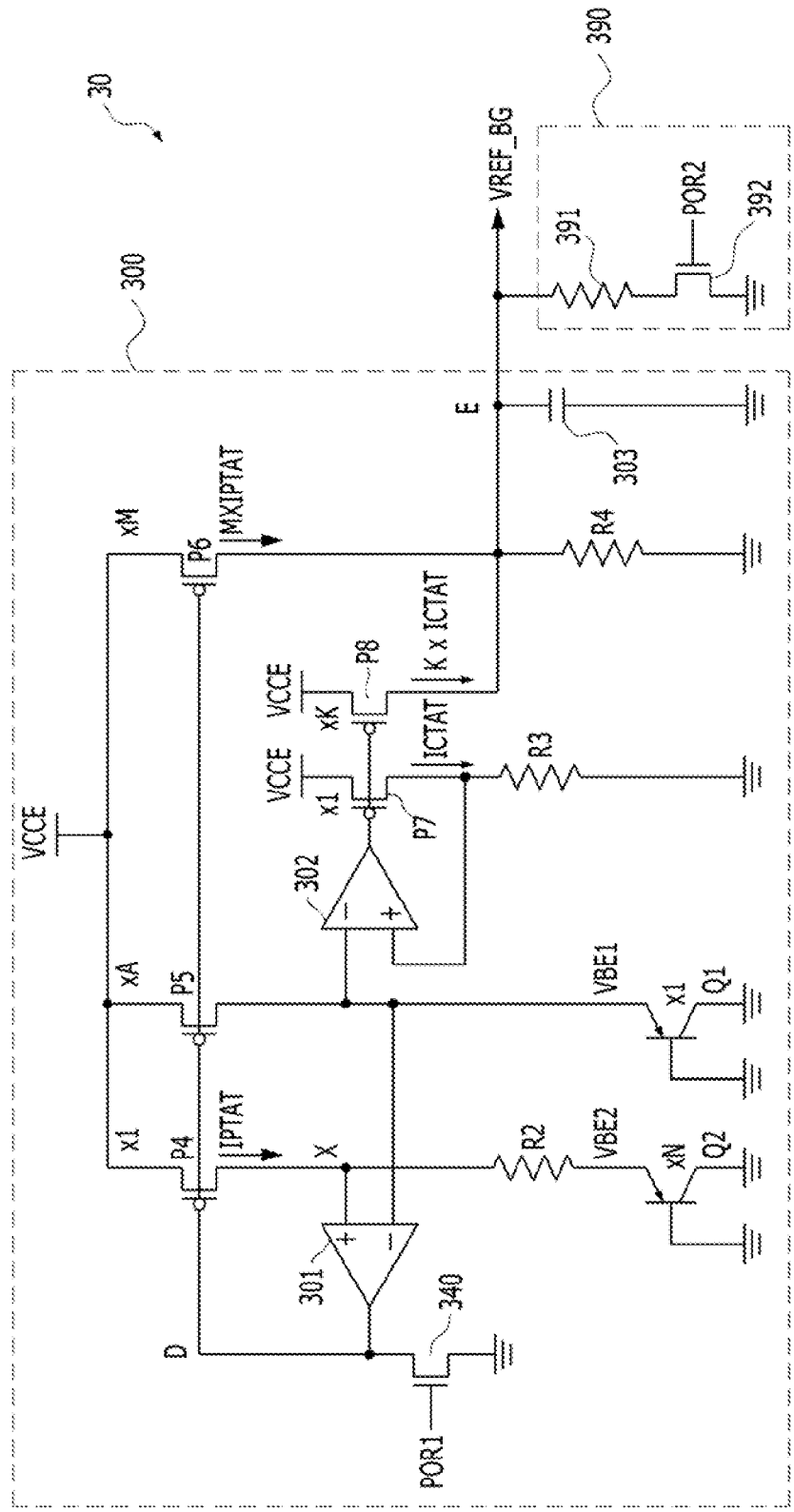
FIG. 3 is a configuration diagram illustrating a voltage generation circuit, in accordance with another embodiment of the invention.

FIG. 3 is a configuration diagram illustrating a voltage generation circuit, according to another embodiment.

According to the embodiment of FIG. 3, a voltage generation circuit 30 may include a voltage generator 300 initialized in response to the first power on reset signal POR1 and for generating an Internal voltage VREF_BG on an output node E using an external voltage VCCE, and a pull-down driving unit 390 for pull-down driving the output node E in response to the second power on reset signal POR2. The voltage generator 300 illustrated in FIG. 3 may be referred to as a band-gap type voltage generator.

The voltage generator 300 may include an initialization unit 340 for initializing a control node D of PMOS transistors P4, P5 and P6 at a power-on reset. The initialization unit 340 may initialize the control node D to a low level during a high level of the first power on reset signal POR1 and thus stabilize an operation of the voltage generator 300 after the initialization. However, since the PMOS transistors P4, P5 and P6 are turned on by the initialization operation of the initialization unit 340, a voltage of the output node E may increase during the initialization operation of the initialization unit 340. During the initialization operation of the voltage generator 300, the internal voltage VREF_BG of the output node E may excessively increase, and a circuit operating with the internal voltage VREF_BG output from the voltage generation circuit may be abnormally operated or out of order due to the excessively increased level of the internal voltage VREF_BG.

The pull-down driving unit 390 may prevent the internal voltage VREF_BG from excessively increasing by pull-down driving the output node E in response to the second power on reset signal POR2 during the initialization operation of the voltage generator 300. The initialization unit 340 may include a NMOS transistor operable in response to the first power on reset signal POR1. The pull-down driving unit 390 may include a resistor 391 and a NMOS transistor 392 operable in response to the second power on reset signal POR2.

The voltage generator 300 may include operational amplifiers 301 and 302, BJT transistors Q1 and Q2, PMOS transistors P4 to P8, resistors R2 to R4, and a capacitor 303. An operation of the voltage generator 300 will be described below.

The following Equation 9 represents emitter currents of two BJT transistors Q1 and Q2 having a ratio of N:1.

$$I_{Q1}=I_S*\exp[VBE1/V_T]$$

$$I_{Q2}=N*I_S*\exp[VBE2/V_T]$$

$$I_{Q1}=A*I_{Q2} \quad \text{[Equation 9]}$$

Wherein, in Equation 9, $V_T$ represents a temperature coefficient, VBE1 and VBE2 respectively represent base-emitter voltages of the BJT transistors Q1 and Q2.

When potentials of a node VBE1 and a node X are the same as each other through the operational amplifier 301, a current IPTAT flowing through the resistor R2 is derived as following Equation 10.

$$IPTAT=(VBE1-VBE2)/R2=ln(N*A)*V_T/R2 \quad \text{[Equation 10]}$$

A current ICTAT flowing through the resistor R3 under the same condition is derived as the following Equation 11.

$$ICTAT=VBE1/R3 \quad \text{[Equation 11]}$$

Herein, since the base-emitter voltages VBE1 and VBE2 of the BJT transistors Q1 and Q2 may change according to the temperature, the current IPTAT may be proportional to the temperature, and the current ICTAT may be inversely proportional to the temperature.

On the assumption that the same amount of current flows in a MOS transistor of the same size, a current flowing the PMOS transistor P6 (denoted by "×M" in FIG. 3) having a size "M" times greater than the PMOS transistor P4 through which the current IPTAT flows and a current flowing a PMOS transistor (denoted by "×K" in FIG. 3) having a size "K" times greater than a PMOS transistor (denoted by "×1" in FIG. 3) through which the current ICTAT flows may be to a M*IPTAT and a K*ICTAT as illustrated in FIG. 3.

The internal voltage VREF_BG output on the basis of this is represented by the following Equation 12.

$$VREF\_BG=K*R4/R3*(VBE1+(M*R4)/(K*R2)*\\ ln(N*A)*V_T) \quad \text{[Equation 12]}$$

Wherein, in Equation 12, when values of M, R2, R3, R4, K, and N are appropriately adjusted for compensating the temperature, the internal voltage VREF_BG may always have a constant value even the temperature changes. Generally, the internal voltage VREF_BG may be adjusted to have the constant value regardless of the temperature by fixing the values of N, R2, R3, and R4 and adjusting only the values of K and M.

Since the internal voltage VREF_BG generated by the band-gap voltage generator 300 maintains a constant level even when the temperature changes, the internal voltage VREF_BG may be inputted to a circuit as a reference voltage.

Figure 4:
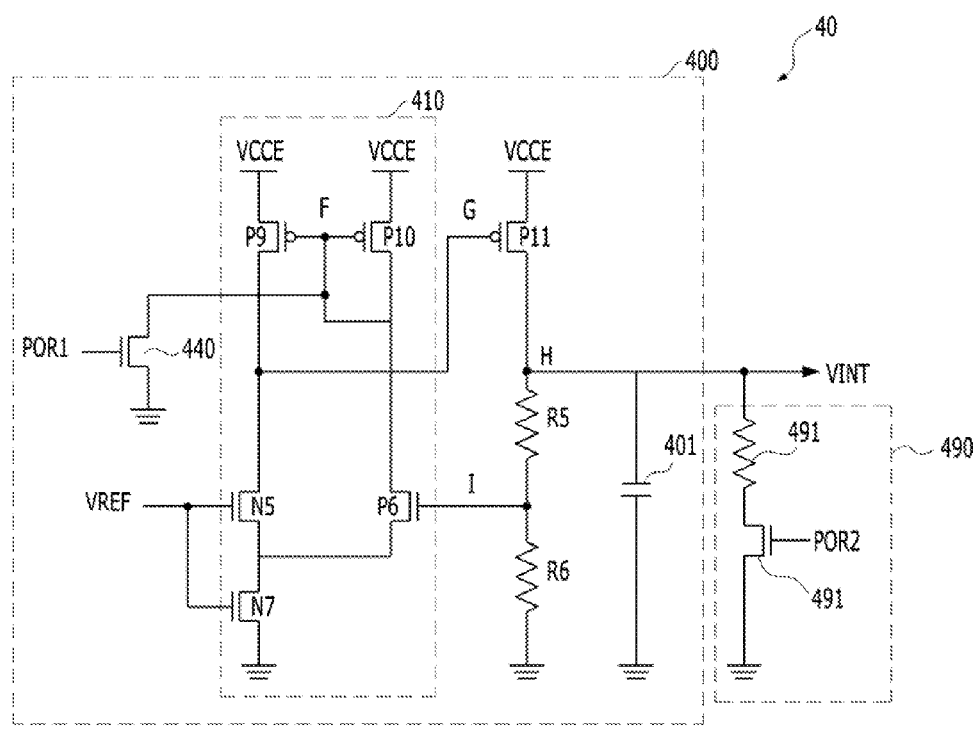
FIG. 4 is a configuration diagram illustrating a voltage generation circuit, in accordance with yet another embodiment of the invention.

FIG. 4 is a configuration diagram illustrating a voltage generation circuit, in accordance with yet another embodiment.

According to the embodiment of FIG. 4, the voltage generation circuit 40 may include a voltage generator 400 initialized in response to the first power on reset signal POR1 and for generating an internal voltage VINT on an output node H using an external voltage VCCE, and a pull-down driving unit 490 for pull-down driving the output node H in response to the second power on reset signal POR2. The voltage generator 400 illustrated in FIG. 4 may be referred to as a low drop out regulator (LDR), voltage generator (hereinafter also referred to as an LDR voltage generator).

The voltage generator 400 may include an initialization unit 440 for initializing a control node F of PMOS transistors P9 and P10 at a power-on reset. The initialization unit 440 may include a NMOS transistor operable in response to the first power on reset signal POR1. The pull-down driving unit 490 may pull-down drive the output node H of the voltage generator 400 in response to the second power on reset signal POR2. The pull-down driving unit 490 may include a resistor 491 and a NMOS transistor 492 operable in response to the second power on reset signal POR2.

The voltage generator 400 may include an operational amplifier 410 for comparing a feedback voltage I and a reference voltage VREF, a PMOS transistor P11 for pull-up driving the output node H in response to an output G of the operational amplifier 410, and resistors R5 and R6 for dividing the internal voltage VINT of the output node H and generating the feedback voltage I.

The operational amplifier 410 compares the feedback voltage I and the reference voltage VREF. The operational amplifier 410 may turn on the PMOS transistor P11 when the feedback voltage I is lower than the reference voltage VREF, and may turn off the PMOS transistor P11 when the feedback voltage I is higher than the reference voltage VREF. Finally, the operational amplifier 410 may drive the PMOS transistor P11 so that the feedback voltage I is the same as that of the reference voltage VREF. When the feedback voltage I and the reference voltage VREF are the same, the feedback voltage I may be represented by following Equation 13.

$$I = \frac{R6}{R5+R6} \times VINT = VREF \quad \text{[Equation 13]}$$

Following Equation 13 may be rearranged with respect to the internal voltage VINT into the following Equation 14.

$$VINT = \frac{R5+R6}{R6}sVREF \quad \text{[Equation 14]}$$

Figure 5:
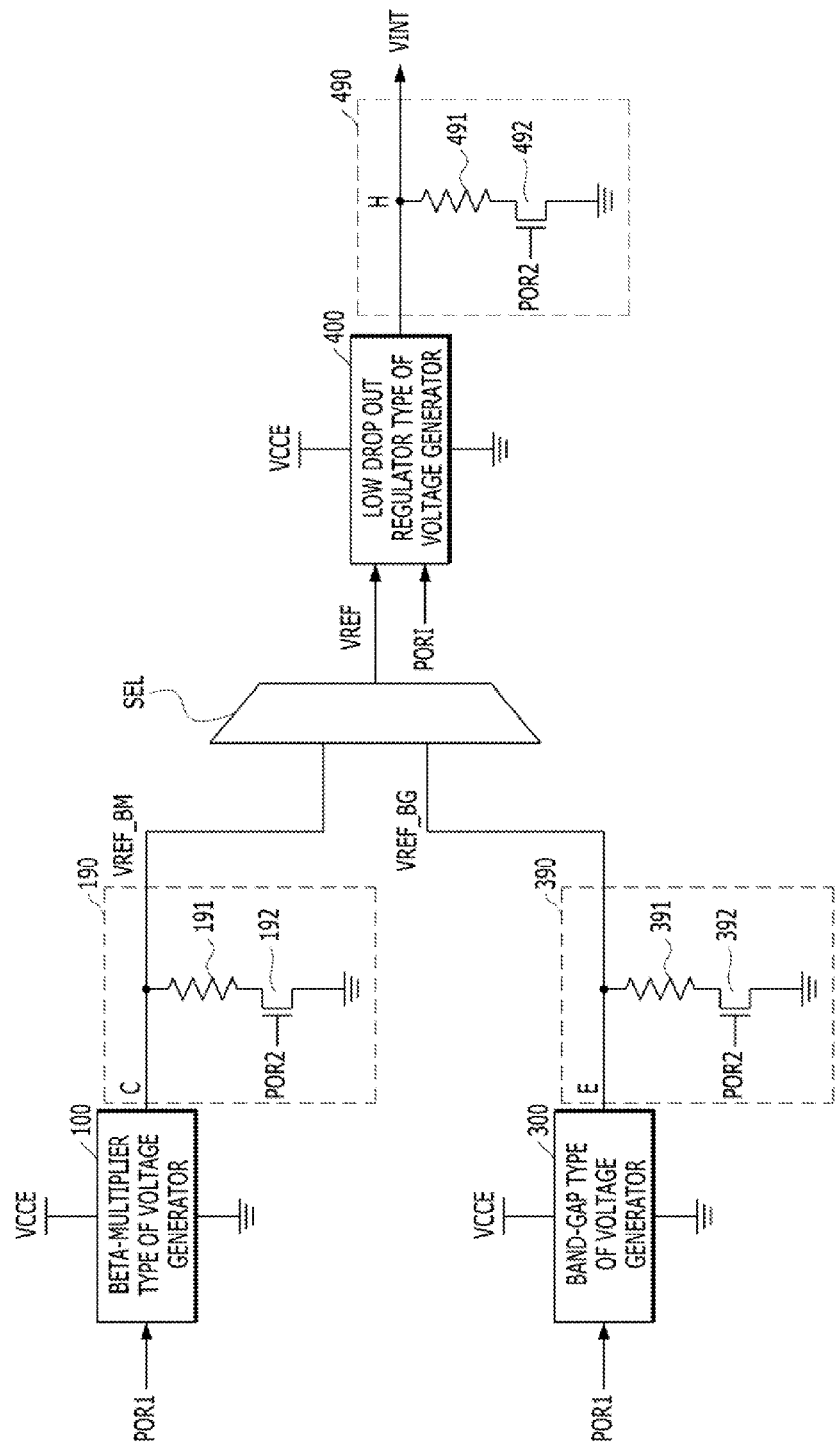
FIG. 5 is a configuration diagram illustrating an integrated circuit, in accordance with an embodiment of the invention.

FIG. 5 is a configuration diagram illustrating an integrated circuit in accordance with an embodiment.

According to the embodiment of FIG. 5, the integrated circuit may include the beta-multiplier, voltage generator 100 described with reference to FIGS. 1 and 2, the band-gap, voltage generator 300 described with reference to FIGS. 2 and 3, the LDR voltage generator 400 described with reference to FIGS. 2 and 4, first to third pull-down driving units 190, 390 and 490, and a multiplexer 510 described with reference to FIGS. 1 to 4.

The beta-multiplier voltage generator 100 may be initialized in response to the first power on reset signal POR1, and generate the internal voltage VREF_BM as a reference voltage on a first output node C using an external voltage VCCE. The first pull-down driving unit 190 may prevent the internal voltage VREF_BM from excessively increasing by pull-down driving the first output node C in response to the second power on reset signal POR2 during the initialization operation of the beta-multiplier voltage generator 100.

The band-gap, voltage generator 300 may be initialized in response to the first power on reset signal POR1, and generate the internal voltage VREF_BG a reference voltage on a second output node E using the external voltage VCCE. The second pull-down driving unit 390 may prevent the internal voltage VREF_BG from excessively increasing by pull-down driving of the second output node E in response to the second power on reset signal POR2 during the initialization operation of the band-gap voltage generator 300.

The multiplexer 510 may select any one of the internal voltages VREF_BM and VREF_BG in response to a selection signal, and supply the selected internal voltage to the low drop out regulator voltage generator 400. That is, the LDR voltage generator 400 may selectively use the internal voltages VREF_BM and VREF_BG as the reference voltage VREF.

The LDR voltage generator 400 may be initialized in response to the first power on reset signal POR1, and generate an internal voltage VINT on a third output node H using the external voltage VCCE. The third pull-down driving unit 490 may prevent the internal voltage VINT from excessively increasing by pull-down driving the third output node H in response to the second power on reset signal POR2 during the initialization operation of the LDR voltage generator 400. The internal voltage VINT may be input to a circuit electrically coupled to the LDR voltage generator 400 in the integrated circuit.

As described above, in an embodiment, an output node of a voltage generator may be initialized to a low level while the voltage generator is initialized. Accordingly, malfunction or breakdown of a circuit operating with the internal voltages output from the voltage generation circuits due to an abrupt increase of an internal voltage generated in the voltage generator after the initialization may be prevented.

Although various embodiments have been described for illustrative purposes, it will be apparent to those skilled in the art that various changes and modifications may be made without departing from the spirit and/or scope of the invention as defined in the following claims.

What is claimed is:

1. An integrated circuit comprising:
    a beta-multiplier voltage generator initialized in response to a first power on reset signal, and suitable for generating a first reference voltage on a first output node using an external voltage;
    a band-gap voltage generator initialized in response to the first power on reset signal, and suitable for generating a second reference voltage on a second output node using the external voltage;
    a low drop out regulator voltage generator initialized in response to the first power on reset signal, and suitable for generating an internal voltage on a third output node using any one of the first reference voltage and the second reference voltage, and the external voltage; and
    a first to a third pull-down driving units suitable for respectively pull-down driving the first to third output nodes in responses to a second power on reset signal delayed from the first power on reset signal.

2. The integrated circuit of claim 1, wherein the first power on reset signal is enabled until the external voltage reaches a predetermined level, and is disabled on or after the reaching of the level of external voltage to the predetermined level.

3. The integrated circuit of claim 1,
    wherein each of the beta-multiplier voltage generator, the band-gap voltage generator, and the low-drop-out regulator voltage generator comprises one or more PMOS transistors, and
    wherein the one or more PMOS transistors are turned on when the first power on reset signal is enabled.

4. The integrated circuit of claim 1,
    wherein each of the first to the third pull-down driving unit comprises a resistor and a switching element coupled in series between the output nodes corresponding thereto and a ground terminal, and
    wherein the switching element is operable in response to the second power on reset signal.

5. The integrated circuit of claim 4, wherein the switching element is a NMOS transistor.

* * * * *